United States Patent
Scoggins et al.

(10) Patent No.: US 10,882,774 B2
(45) Date of Patent: Jan. 5, 2021

(54) COATINGS FOR GLASS-SHAPING MOLDS AND MOLDS COMPRISING THE SAME

(71) Applicant: Entegris, Inc., Billerica, MA (US)

(72) Inventors: Troy Scoggins, Decatur, TX (US); Rex Gerald Sheppard, Decatur, TX (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 158 days.

(21) Appl. No.: 16/137,730

(22) Filed: Sep. 21, 2018

(65) Prior Publication Data

US 2019/0084862 A1  Mar. 21, 2019

Related U.S. Application Data

(60) Provisional application No. 62/561,493, filed on Sep. 21, 2017.

(51) Int. Cl.
| | |
|---|---|
| *C03B 11/08* | (2006.01) |
| *C23C 16/455* | (2006.01) |
| *C23C 16/40* | (2006.01) |
| *C23C 28/04* | (2006.01) |
| *C23C 28/00* | (2006.01) |
| *C03B 40/00* | (2006.01) |

(52) U.S. Cl.
CPC ............ *C03B 11/086* (2013.01); *C03B 40/00* (2013.01); *C23C 16/403* (2013.01); *C23C 16/405* (2013.01); *C23C 16/45555* (2013.01); *C23C 28/042* (2013.01); *C23C 28/42* (2013.01); *C03B 2215/03* (2013.01); *C03B 2215/05* (2013.01); *C03B 2215/20* (2013.01); *C03B 2215/31* (2013.01); *C03B 2215/32* (2013.01); *C03B 2215/34* (2013.01)

(58) Field of Classification Search
None
See application file for complete search history.

(56) References Cited

U.S. PATENT DOCUMENTS

| | | | |
|---|---|---|---|
| 3,848,739 A | 11/1974 | Fagan | |
| 5,876,478 A | 3/1999 | Imamura et al. | |
| 2005/0016706 A1* | 1/2005 | Ray ........................ | B22C 3/00 164/97 |
| 2012/0047953 A1 | 3/2012 | Feng et al. | |
| 2014/0224958 A1 | 8/2014 | Feng et al. | |
| 2015/0114042 A1* | 4/2015 | Gaylo .................. | C03B 23/025 65/29.1 |

(Continued)

FOREIGN PATENT DOCUMENTS

| | | |
|---|---|---|
| CN | 105705670 A | 6/2016 |
| JP | 10-007424 A | 1/1998 |

(Continued)

OTHER PUBLICATIONS

Salmi, "Atomic Layer Deposited Coatings for Corrosion Protection of Metals", Univ. of Helsinki, Finland, Dept. of Chem. 84 pages, 2015. (Year: 2015).*

(Continued)

*Primary Examiner* — Lisa L Herring
(74) *Attorney, Agent, or Firm* — Entegris, Inc.

(57) ABSTRACT

Described are glass-forming molds made of a graphite mold body and a coating formed by atomic layer deposition, with the coating being made of alumina or a combination of alumina and yttria.

10 Claims, 1 Drawing Sheet

(56) References Cited

U.S. PATENT DOCUMENTS

2017/0044045 A1* 2/2017 Chiang ................ C03B 11/086
2018/0072606 A1* 3/2018 Chou ..................... C03C 17/00
2019/0263708 A1* 8/2019 Bookbinder ............ C03B 23/03

FOREIGN PATENT DOCUMENTS

TW          201702191 A      1/2017
WO        2017011315 A2      1/2017

OTHER PUBLICATIONS

Miller et al., "Thermo-mechanical properties of alumina films created using the atomic layer deposition technique", Sensors and Actuators A 164 (2010), pp. 58-67. (Year: 2010).*

Hupp et al., "Graphite, Properties of Artificial", Kirk-Othmer Encyclopedia of Chemical Technology, 2003, pp. 1-7. (Year: 2003).*

* cited by examiner

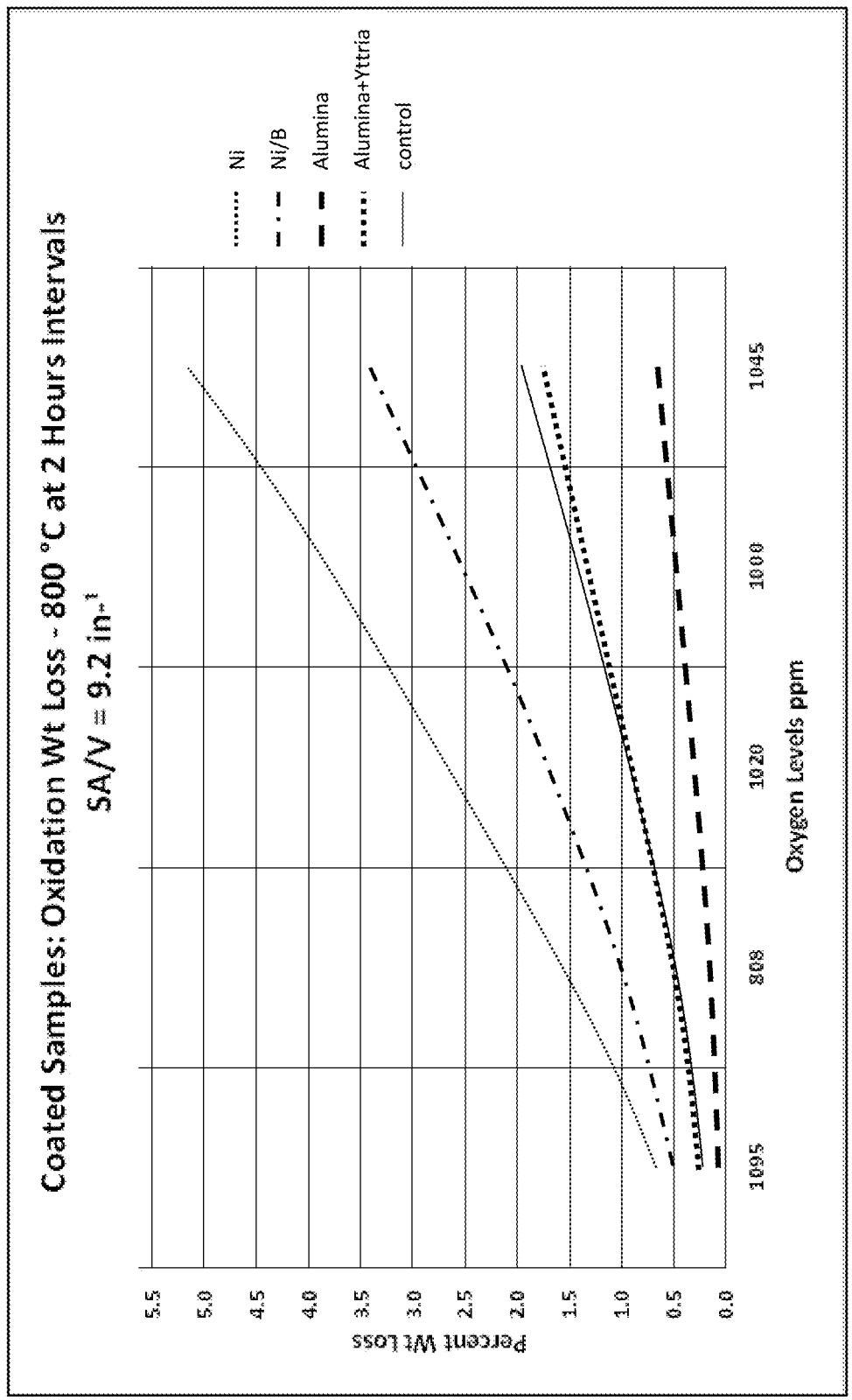

COATINGS FOR GLASS-SHAPING MOLDS AND MOLDS COMPRISING THE SAME

CROSS-REFERENCE TO RELATED APPLICATIONS

This application claims the benefit under 35 USC 119 of U.S. Provisional Patent Application No. 62/561,493, filed Sep. 21, 2017, the disclosure of which is hereby incorporated herein by reference in its entirety for all purposes.

FIELD OF THE INVENTION

The following description relates to coatings deposited by atomic layer deposition onto a glass-shaping mold made of graphite, to glass-shaping molds that include such a coating, and to methods of making and using the coated glass-shaping molds.

BACKGROUND

Graphite is used in glass manufacturing equipment for glass-bending and other-glass forming operations, e.g., as a "mold." Graphite can be effective for these uses because glass tends to not stick to graphite, and because graphite is relatively easy to form into a desired shape of a mold by machining. Despite such advantages, however, a challenge in the use of graphite as a glass-shaping mold is that graphite is susceptible to oxidation at temperatures at which glass-bending or other glass-forming operations occur. To change the shape of glass, e.g., by molding, the glass must be heated to a very high temperature, for example in a range from 400° C. to 900 C, at which temperature the glass softens (e.g., "melts") to a degree that allows the softened glass to be re-shaped by use of a mold. Temperatures in this range can also cause oxidation of graphite at a surface of a mold. Such oxidation can create pits or other defects at the mold surface that in turn produce dimples or other surface asperities on glass that is formed using the mold.

To prevent oxidation of graphite at a surface of a graphite mold at glass-softening temperatures, International PCT Patent Application 2017/011315 (International Application Number PCT/US2016/041554) describes coatings that can be placed over a surface of a precision glass-shaping graphite mold. The coatings may contain a titanium material or yttria. As a different approach for a glass mold, U.S. Patent Application Publication 2014/0224958A1 describes a stainless steel mold that is coated with an aluminum-titanium alloy or a corresponding alloy oxide, as a non-stick surface on a non-oxidizable substrate. The coating, however, is made of multiple layers, including, for example, a metal diffusion barrier layer, to protect softened glass from the metal of the underlying mold. In addition, metal molds require extensive machining and surface finishing, and are expensive to manufacture.

While various types of molds are presently available and useful for forming glass articles, improvements in mold constructions are always desirable, for example to provide new glass-forming molds that: can be used to form precision-molded articles; that are relatively easy and economical to prepare (e.g., by machining); and that have reduced susceptibility to oxidation and, consequently, can be used repeatedly for an extended useful lifetime of forming precision molded glass articles.

SUMMARY

The following description relates to coatings for glass-shaping molds made of graphite, to glass-shaping molds that include such coatings, and to methods of making and using such molds.

Examples of the molds that include a coating as described are precision glass-shaping molds that include a mold body made of graphite that includes (e.g., comprises, consists of, or consists essentially of) fine-grained graphite, particularly fine-grained graphite that is also purified. The mold includes the body made of the graphite, and the coating as described herein. The mold body may include one or more mold features, and the coating can be placed on the surface of the mold body, e.g., to cover or encapsulate the surface of the mold body, including the one or more mold features. The coating is prepared by atomic layer deposition. Example coatings can comprise, consists of, or consist essentially of alumina deposited by atomic layer deposition. Other example coatings can comprise, consists of, or consist essentially of alumina and yttria deposited by atomic layer deposition.

In example embodiments, a precision glass mold that includes a coating as described, formed by atomic layer deposition, can be a precision mold that is substantially free of surface discontinuities, e.g., dimples, cavities, protrusions, and other surface asperities or defects that are greater than about 25 microns in size relative to the average surface plane of the mold, and is preferably free of such deviations from such average surface plane that are greater than 20 microns, e.g., greater than 10 microns.

In these and other example embodiments, a precision glass mold can be made by a method of using atomic layer deposition to form a coating as described on surfaces of the mold body, with the mold body and surfaces being made of purified, fine-grain graphite and having one or more mold features.

In various embodiments of the described coated mold bodies and methods, the coating has a coefficient of thermal expansion that approximates the coefficient of thermal expansion of the mold body, e.g., that differs from the coefficient of thermal expansion of the graphite mold body by no more than one part per million per degree Celsius.

The invention as presented in the following description also relates to methods of forming glass that include contacting softened glass with a glass-forming mold as described, e.g., that includes a graphite mold body as described with a coating on the surface that is applied by atomic layer deposition.

BRIEF DESCRIPTION OF THE DRAWING

FIG. 1 is a graph showing oxidation weight loss of glass-forming molds of the present invention.

DETAILED DESCRIPTION

The following is a description of molds that are useful for forming an article made of glass, a.k.a. "glass molds," "precision glass molds," "glass-forming molds," "precision glass-forming molds," or the like. A glass mold of the description includes a graphite mold body that has surfaces that are coated (e.g., entirely, such as being "encapsulated") with a coating made of a material that is applied by atomic layer deposition, such as a coating that includes alumina or a combination of alumina and yttria. The coating is effective to inhibit the amount of oxidation that occurs to graphite of the surface of the body during use of the mold to form or shape softened glass. Reducing the amount of oxidation that occurs during use has the effect of extending the useful lifetime of the mold, meaning that the mold can be used to produce a greater number of molded glass articles during a period of use. The description also relates to methods of placing a coating as described onto a surface of a graphite mold body by atomic layer deposition, and to methods of using a coated graphite mold body in a step of forming or molding a piece of softened glass.

A preferred graphite mold body as described is a mold body made of fine-grained graphite. The mold body includes one or more mold features and is shaped and adapted to be used to form a three-dimensional article from softened glass that is pressed into the mold body. A preferred mold body can be used repeatedly to form multiple glass articles, e.g., many hundreds or thousands of glass articles. A "mold feature" may be a cavity, a recess, a protrusion, or a combination of these, such as a cavity that includes one or more protrusions, a cavity that includes one or more openings or recesses, or any other features used to form a shaped glass article.

A preferred mold body is made of fine-grain graphite. While graphite in general is a material that can be readily machined in an efficient and cost-effective manner, when large grain size graphite is used, the machining operation can produce pits in a graphite mold surface that in turn cause dimples or other surface asperities on a glass surface formed using the graphite mold. Accordingly, preferred mold bodies can be made of, e.g., may comprise, consist essentially of, or consist of fine-grain graphite. As used generally herein, an article or composition (e.g., a mold body) that "consists essentially of" a specified material or combination of materials is an article or composition that contains the material or combination of materials and not more than an insignificant amount of any other material, e.g., not more than 1 percent by weight, preferably not more than 0.5, 0.1, or 0.01 percent by weight of another material.

As used herein, "fine-grain graphite" refers to graphite stock or ingot that comprises, consists of, or consists essentially of graphite particles (grains) with sizes that do not exceed 10 microns. In some embodiments the graphite particle sizes (grain sizes) of the fine-grain graphite may be on the order of 1 micron in size. In other embodiments, the graphite particle (grain) sizes may be on the order of 5 microns in size, and in still other embodiments, the graphite particle (grain) sizes may be on the order of 10 microns. It will be recognized that in various embodiments, the grain size of the graphite may fall substantially within a limited range of a grain size distribution, e.g., in a range of from 1 to 10 microns, or a range of from 2 to 10 microns, 2 to 8 microns, 1.5 to 6.5 microns, or over another suitable range. It may be preferred to use graphite stock or ingot having a uniform or substantially uniform grain size, so that the coefficient of thermal expansion (CTE), as well as other performance characteristics of a mold body made from the graphite, are as isotropic and homogeneous as possible.

Fine-grain graphite particles having selected grain size, including a useful or preferred grain size or grain size distribution as described herein, can be prepared by known methods and are also available from commercial sources. Grain size may be selected by sieving graphite particles using standard sieves to achieve a desired particle size. A non-limiting example of graphite with a (fine) grain size of about 10 microns or less is commercially available from Poco Graphite, Decatur, Tex., USA under the trademark Glassmate-LT®.

In preferred examples, graphite of the graphite body can be purified to reduce contaminants and form a high purity graphite body, as described for example in U.S. Pat. No. 3,848,739, wherein a graphite mold body or graphite stock body is placed within a purification furnace in which the body is contacted by a halogen-containing gas for a period of time and at a temperature sufficient to permit penetration of the halogen into the graphite body, to cause the halogen to react with and volatilize inorganic impurities and to expel such impurities from the graphite. Particularly preferred graphite can be purified to contain less than 5 parts per million (by weight) of inorganic impurities as measured by a standard ash test.

The mold of the present description includes a mold body as described having a coating over the surface of the body, wherein the coating is made of material that will inhibit or reduce, the amount of oxidation of the graphite that occurs at the surface of the graphite mold body during use of the mold body in a method that contacts the surface of the mold body with softened glass. In various embodiments, the coating completely covers, e.g., encapsulates, the entire surface or substantially the entire surface of the graphite mold body and the one or more mold features. The coating can substantially reduce the extent of oxidation of the underlying graphite mold body surface during glass molding, as compared to the amount of oxidation that would result if the same graphite mold body were used in the absence of the coating. The coating can also, preferably, provide a release, or non-stick, surface to prevent, at least to a large extent, softened glass (and a resultant solidified glass article) from sticking to the mold body surface, thereby preventing or reducing the likelihood of the creation of defects in a molded glass article produced by the mold during glass molding and release operations, e.g., compared to the extent of sticking that would occur if the same molded glass article were formed using the same mold body surface in the absence of the coating.

A preferred mold body can be useful as a mold body of a precision glass-forming mold, which can means that the mold body includes a smooth surface that, with placement of the coating at the surface, is effective to produce precision molded glass articles. By one measure, a precision glass-forming mold can be a mold that includes a coated surface that is free of or substantially free of surface discontinuities, e.g., dimples, cavities, protrusions, and other surface asperities or defects, that are greater than about 25 microns relative to the average surface plane of the mold, and is preferably free of any deviations from such average surface plane that are greater than 20 microns, e.g., greater than 10 microns.

Preferred coatings are coatings that are applied by atomic layer deposition (ALD) and that are made of (e.g., comprise, consist of, or consist essentially of) alumina, or that are made of (e.g., comprise, consist of, or consist essentially of) multiple alternating layers of alumina and yttria. Applicant has experimentally determined that a graphite mold body that includes a coating made of alumina applied by ALD, or a coating made of multiple alternating layers (e.g., a bi-layer coating or a composite coating) of alumina and yttria, exhibits less oxidation weight loss compared to identical graphite mold bodies coated with other materials, or that are uncoated (using example test conditions that include a temperature of 800 degrees Celsius, with exposure to an atmosphere of about 800 to 1100 parts per million oxygen, and a surface area to volume of about 9/inch). Results are shown in FIG. 1.

One example of a coating as described can be a single-layer coating made of (e.g., comprising, consisting essentially of, or consisting of) a single layer of alumina (AlOx) applied by atomic layer deposition. Examples of such coatings can contain only alumina, applied directly to the surface of the graphite mold body. An alumina layer that consists essentially of alumina, or a coating that consists essentially of alumina, is a layer or a coating that contains not more than an insubstantial amount of any other material, e.g., less than 1, 0.5, 0.1, or 0.01 weight percent of any other material, based on total weight of the alumina layer or the coating.

Another example of a useful coating can be a multi-layer coating made of (e.g., comprising, consisting essentially of, or consisting of) layers of two different materials, both deposited by atomic layer deposition, one layer being alumina (AlOx) and the second layer being yttria (YOx). Examples of such coatings can contain layers that are made of these two different deposited materials, e.g., comprise, consist of, or consist essentially of these two different materials, applied directly to the surface of the graphite mold body. A layer of a coating that consists essentially of alumina or of yttria is a layer that contains not more than an insubstantial amount of a different material, e.g., less than 1.0, 0.5, 0.1, or 0.01 percent by weight of any other material, based on the total weight of the layer. A coating that consists essentially of alumina and yttria is a layer that contains not more than an insubstantial amount of materials other than the alumina and yttria, e.g., less than 1.0, 0.5, 0.1, or 0.01 percent by weight of any other material, based on the total weight of the layer.

As used herein the term "multi-layer" coating refers to a coating that is applied to a surface by a series of atomic layer deposition steps, to form multiple different and alternating "layers" of deposited materials (e.g., alternating layers of alumina and yttria). If deposition produces incomplete individual layers, the multi-layer coating may be considered to be a composite coating. A "bi-layer" film is made of (consists of or consists essentially of) only two different and distinct deposited materials (e.g., alternating layers of alumina and yttria).

A thickness of the coating can be a thickness that is useful to provide desired performance of a coated mold body, such as desired anti-stick performance, resistance to oxidation of an underlying graphite surface, and durability in the form of a useful or extended lifetime for use of the coated mold body as a precision glass-forming mold. In some example coating, thickness is chosen to reduce oxidation of the underlying graphite. In various embodiments, the thickness of the coating can be greater than or equal to 10 nanometers and less than or equal to 500,000 nanometers, i.e., 10 nm<thickness<500,000 nm, e.g., a thickness in a range from 50 to 500 nanometers or from 100 to 300 nanometers. Any other coating thickness may also be used, as is considered to be useful and suitable for a desired glass-forming mold or a selected portion or segment of a glass-forming mold.

The coating may preferably be disposed over the entire surface of the mold body, e.g., to entirely cover (e.g., encapsulate) the mold body to inhibit oxidation of the graphite of the mold surface. This allows the glass mold to be made from inexpensively machined graphite. It can be important, however, that the coating does not become removed from the graphite surface during use, for example when contacted with softened glass that is solidified and subsequently removed from contact with the surface. To prevent the coating from being removed upon contact with softened glass and subsequent removal of the solidified glass, the coating can have a coefficient of thermal expansion (CTE) that is a close match to the CTE of the underlying graphite mold body. Respective coefficients of thermal expansion of the underlying mold body and the coating will prevent a difference in thermal expansion of the coating relative to the mold body during contact with softened glass and solidification and removal of the solidified glass, so that the coating exhibits good adhesion to the graphite mold body surface.

Preferably, the coating can have a coefficient of thermal expansion that differs from the coefficient of thermal expansion of the graphite of the mold body by an amount that does not exceed one part per million/° C. of the CTE of the graphite, wherein both the CTE of the coating and the CTE of the graphite of the mold body are measured by the same technique in the same units. A CTE differential of one part per million/° C. or less reduces the susceptibility of the coating to differential thermal expansion and contraction effects that would otherwise cause the coating to be susceptible to delamination from the graphite surface of the mold body, i.e., at a larger CTE differential between the coating and the graphite of the mold body. For example, a fine-grained graphite body used to prepare a glass-forming mold body as described can advantageously have a coefficient of thermal expansion (CTE) that is in a range of from 7 to 9 parts per million/° C., with a difference between the respective CTE values of the coating and the graphite body being not more than one part per million/° C., preferably less than 0.75 ppm/° C., and more preferably is less than 0.5 ppm/° C.

For preferred molding applications, the coated mold surface can be sufficiently smooth that softened glass does not stick to the mold surface during use, including during contacting softened glass with the coated surface, allowing the softened glass to solidify, and removing the solidified glass from the surface. A preferred coated surface can have a surface roughness that does not exceed about 25 microns in deviation from the average surface plane of the mold, e.g., that does not exceed about 20, 15, or 10 microns in deviation from the average surface plane can be a precision glass mold. This level of smoothness of a mold surface can allow the mold to be useful to produce molded glass articles that can be used to make the cover glass for various consumer electronic devices such as cellular phones, medical instruments, optical devices, etc. It will be appreciated that the surface of the mold body may also or alternately be characterized in other terms, e.g., with reference to root mean square roughness or other parameterizing characteristics, to specify a surface of a mold body that has a desirably smooth molding surface. A surface finish or smoothness of a coated surface of a mold can be measured mechanically with commercially available profilometers or laser devices. The coated mold surface can also be indirectly evaluated by examining light-scattering characteristics of surfaces of pressed glass elements produced by the mold.

A glass mold of the present description can be used for molding glass articles, e.g., precision molding glass articles, by steps that include contacting the coated surface of the mold with softened glass, allowing the softened glass to solidify within the mold, and removing the solidified glass from the coated surface and the mold. The type of glass that is molded by contact with the coated mold surface may generally be any glass suitable for three-dimensional forming. In some example embodiments, the glass may be ion-exchangeable alumino-silicate glass. Preferably, the method can be used to form a solidified precision glass object or article that is substantially free of wrinkles, dimples, cavities, protrusions, and other surface discontinuities and asperities that are not components of the mold. The articles formed by the glass mold in embodiments described herein can be used in consumer electronic devices (e.g., hand-held commercial or consumer electronic devices), medical instruments, optical devices, and other applications requiring precision-molded glass articles.

What is claimed is:

1. A glass-forming mold comprising:
   a fine-grained graphite mold body having one or more mold features, wherein the fine-grained graphite has a grain size that is not greater than 10 microns; and
   a coating on the one or more mold features, the coating consisting essentially of alternating layers of alumina and yttria.

2. The glass-forming mold of claim 1, wherein the coating has a coefficient of thermal expansion that is within 1 part per million/° C. of the coefficient of thermal expansion of the fine-grained graphite mold body.

3. The glass-forming mold of claim 1, wherein a thickness of the coating is between 10 nanometers and 500,000 nanometers.

4. The glass-forming mold of claim 1, wherein the glass-forming mold is free of surface discontinuities that are greater than about 25 microns from the average surface plane of the glass-forming mold.

5. A method of making a glass-forming mold comprising:
   providing a fine-grained graphite mold body, wherein the fine-grained graphite has a grain size that is not greater than 10 microns; and
   depositing a coating on the fine-grained graphite mold body by atomic layer deposition, the coating consisting essentially of alternating layers of alumina and yttria.

6. The method of claim 5, wherein the coating has a coefficient of thermal expansion that is within 1 part per million/° C. of the coefficient of thermal expansion of the fine-grained graphite mold body.

7. The method of claim 5, wherein a thickness of the coating is between 10 nanometers and 500,000 nanometers.

8. The method of claim 5, wherein the glass-forming mold is free of surface discontinuities that are greater than about 25 microns from the average surface plane of the glass-forming mold.

9. A method of forming a glass article comprising:
   providing a fine-grained graphite mold body, wherein the fine-grained graphite has a grain size that is not greater than 10 microns;
   depositing a coating on the fine-grained graphite mold body by atomic layer deposition, the coating consisting essentially of alternating layers of alumina and yttria; and
   contacting a surface of the fine-grained graphite mold body with softened glass.

10. The method of claim 9, wherein the softened glass is softened alumino-silicate glass.

* * * * *